Figure 1:
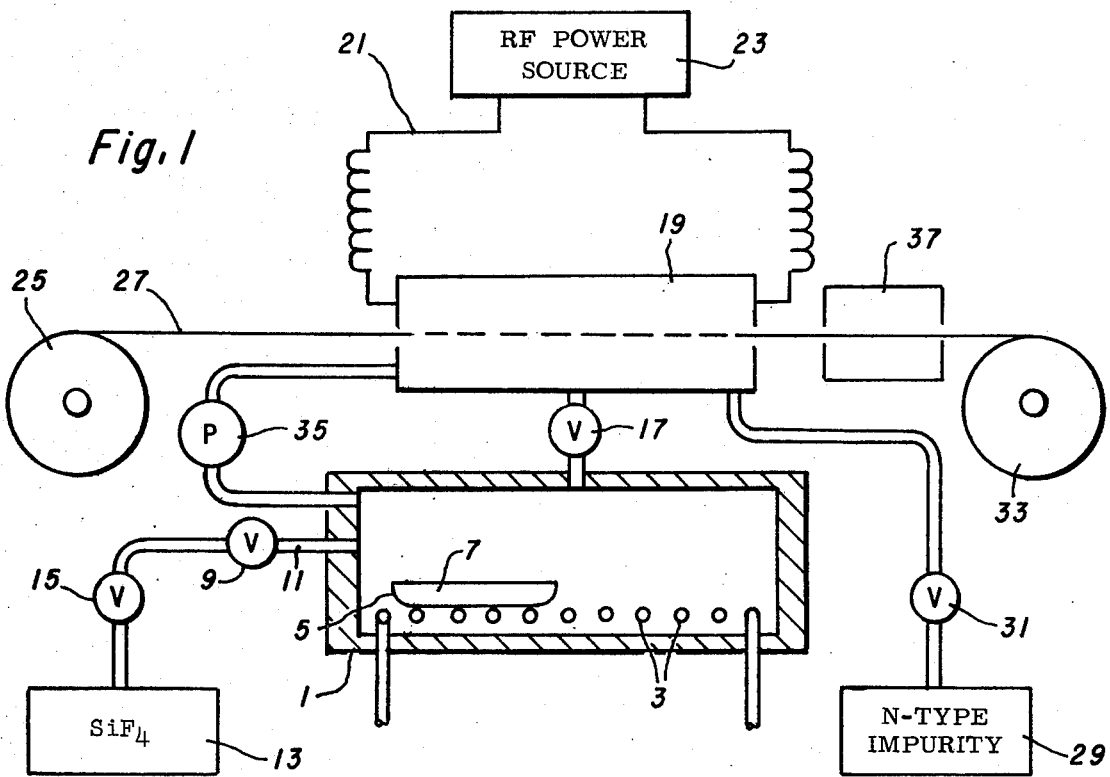

United States Patent [19]
Wakefield

[11] 3,969,163
[45] July 13, 1976

[54] VAPOR DEPOSITION METHOD OF FORMING LOW COST SEMICONDUCTOR SOLAR CELLS INCLUDING RECONSTITUTION OF THE REACTED GASES

[75] Inventor: Gene Felix Wakefield, Richardson, Tex.

[73] Assignee: Texas Instruments Incorporated, Dallas, Tex.

[22] Filed: Sept. 19, 1974

[21] Appl. No.: 507,329

[52] U.S. Cl. .............................. 148/174; 29/572; 118/48; 136/89; 148/175; 156/613; 357/20; 357/30; 357/59; 357/65; 427/86; 427/113; 427/248

[51] Int. Cl.² ............. H01L 21/205; H01L 21/84; H01L 31/00

[58] Field of Search .............. 148/174, 175; 136/89; 357/30; 156/613; 423/341–344, 348–350, 489; 427/86, 113, 248; 118/48–49.5; 29/572

[56] References Cited
UNITED STATES PATENTS

| | | | |
|---|---|---|---|
| 2,537,255 | 1/1951 | Brattain | 136/89 |
| 2,763,581 | 9/1956 | Freedman | 148/175 X |
| 2,840,489 | 6/1958 | Kempter et al. | 427/248 |
| 2,840,588 | 6/1958 | Pease | 423/341 X |
| 2,877,138 | 3/1959 | Vodonik | 118/49.1 X |
| 2,880,117 | 3/1959 | Hanlet | 148/175 X |
| 2,989,376 | 6/1961 | Schaefer | 423/349 |
| 3,078,328 | 2/1963 | Jones | 136/89 |
| 3,134,906 | 5/1964 | Henker | 136/89 X |
| 3,441,454 | 4/1969 | Shaikh | 118/48 X |
| 3,540,919 | 11/1970 | Bracken | 148/174 X |
| 3,914,856 | 6/1972 | Fang | 148/174 X |

Primary Examiner—L. Dewayne Rutledge
Assistant Examiner—W. G. Saba
Attorney, Agent, or Firm—Harold Levine; James T. Comfort; Gary C. Honeycutt

[57] ABSTRACT

The disclosure relates to a method of upgrading metallurgical grade silicon to semiconductor grade for making low cost silicon devices and particularly solar cells. This is accomplished by passing conductive fibers such as graphite or the like which are compatible with the later processing steps through an area which is cooled below 700° C and which contains silicon difluoride and a proper N-type dopant. At these temperatures, the silicon difluoride gas will break down into pure silicon which will deposit onto the fiber with the formation of silicon tetrafluoride gas which is then recycled into a further chamber. In the further chamber, the gaseous silicon tetrafluoride is mixed with the impure metallurgical grade silicon at temperatures above 700° C to form the silicon difluoride gas which is then fed into the former chamber for deposition of pure silicon onto the continuously moving fibers of graphite or the like. A p-type layer can then be formed over the n-type layer in any standard manner, such as by then passing the coated fibers through a further reaction chamber wherein p-type dopant is diffused into the top surface of the n-type layer that has been formed. The dopants alternatively could be added in the gas stream of $SiF_4$ or the p-layer formed by ion implantation. In this way, relatively inexpensive p-n junction devices are formed without the requirement of purifying, cutting and polishing a silicon slice in the standard manner.

5 Claims, 2 Drawing Figures

VAPOR DEPOSITION METHOD OF FORMING LOW COST SEMICONDUCTOR SOLAR CELLS INCLUDING RECONSTITUTION OF THE REACTED GASES

This invention relates to the formation of semiconductor diodes for use in solar cells and the like and, more specifically, to the formation of such devices using a relatively inexpensive procedure for upgrading silicon from metallurgical grade to semiconductor grade.

With the present problems in obtaining inexpensive energy, one possible solution is in the direction of solar cells due to the relatively constant availability of energy from the sun. The large scale utilization of solar cells for terrestrial solar energy conversion depends heavily upon the manufacturing economics of such cells. However, many years of experimentation with such cells for use in space vehicles indicates that the most promising cell design is that of high conversion efficiency solar cells using single crystal silicon. However, the cost of such cells to date is far greater than that which is considered practical for any large scale terrestrial energy program.

One of the factors which leads to this high cost of silicon solar cells is the cost of producing silicon slices on which the cells can be produced from the initial metallurgical grade silicon. At present, the process steps of upgrading metallurgical grade silicon include: reacting impure silicon with HCl to form impure silicon chlorides; purification of the silicon chlorides by fractional distillation; hydrogen reduction of the pure chlorides; pulling single crystals from molten silicon; slicing the crystals into thin wafers; and polishing the wafers. Fabrication of the wafers into diodes and assembly into cells completes a process too expensive to allow a cost effective cell.

In accordance with the present invention, some of these high cost processing steps for formation of semiconductor grade silicon for manufacture of solar cells and the like are eliminated, thereby materially reducing the cost of manufacture of solar cells from silicon materials. Briefly, in accordance with the present invention, this is accomplished by passing conductive fibers such as graphite or the like which are compatible with the later processing steps through an area which is cooled below 700° C and which contains silicon difluoride and a proper n-type dopant. At these temperatures, the silicon difluoride gas will break down into pure silicon which will deposit onto the fiber with the formation of silicon tetrafluoride gas which is then recycled into a further chamber. In the further chamber, the gaseous silicon tetrafluoride is mixed with the impure metallurgical grade silicon at temperatures above 700° C to form the silicon difluoride gas which is then fed into the former chamber for deposition of pure silicon onto the continuously moving fibers of graphite or the like. A p-type layer can then be formed over the n-type layer in any standard manner, such as by then passing the coated fibers through a further reaction chamber wherein p-type dopant is diffused into the top surface of the n-type layer that has been formed. The dopants, alternatively could be added in the gas stream of $SiF_4$ or the doped layer formed by ion implantation. In this way, relatively inexpensive p-n junction devices are formed without the requirement of purifying cutting and polishing a silicon slice in the standard manner.

The process is totally dry and requires merely electrically conductive graphite sheet or fibers, metallurgical grade silicon, a recirculated supply of silicon tetrafluoride and contact material, such as aluminum.

A key factor for achieving the silicon layers of sufficient quality for solar cells lies in the capitalization on the predicted purification from the silicon fluoride transfer reaction:

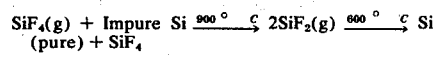

$$SiF_4(g) + \text{Impure Si} \xrightarrow{900°\text{C}} 2SiF_2(g) \xrightarrow{600°\text{C}} Si \text{ (pure)} + SiF_4$$

Most impurities in metallurgical grade silicon will not transfer by this mechanism due to their unfavorable fluoride formation, fluoride volatility and/or fluoride disproportionation.

Metallurgical grade silicon is effectively utilized since crystal growth, sawing, and wet processing are removed.

It is therefore an object of this invention to provide a method of producing semiconductor grade silicon in usable form from metallurgical grade silicon at relatively low cost.

It is a further object of this invention to provide usable layers of semiconductor grade silicon from metallurgical grade silicon in a single coating operation.

It is yet a further object of this invention to provide semiconductor grade silicon from metallurgical grade silicon by converting the metallurgical grade silicon to a gaseous compound containing the silicon free of impurities and then altering the compound whereby the silicon, which is now semiconductor grade, is deposited on a substrate and the remaining gases removed.

Figure 2:
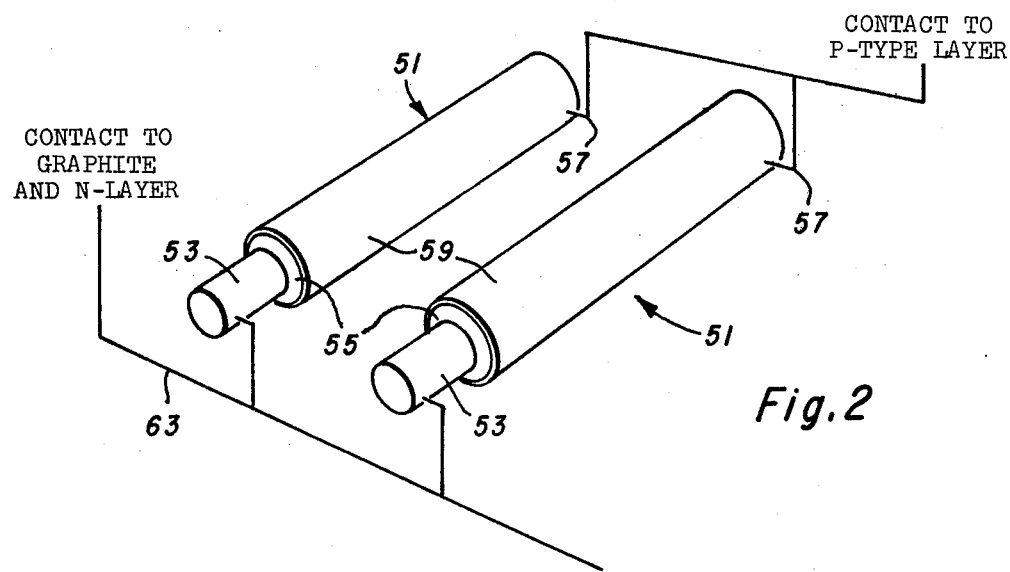

The above object and still further objects of the invention will immediately become apparent to those skilled in the art after consideration of the following preferred embodiment thereof, which is provided by way of example and not by way of limitation wherein:

FIG. 1 is a reaction chamber for carrying out the processing steps in accordance with the present invention; and FIG. 2 is a solar cell formed in accordance with the present invention.

Referring now to FIG. 1, there is shown a heater chamber 1 which is heated by heating coil 3 in the range of from about 750° to about 1200° C and preferably 900° C or, alternatively, which can have a heat zone heated to these temperatures. Within this chamber is a vessel 5 containing metallurgical grade silicon 7 and positioned in the heat zone, if such is used. Also passing into the chamber through a valve 9 is a line 11 through which silicon tetrafluoride is passed from a source of silicon tetrafluoride 13 by a valve 15. At the elevated temperatures within the vessel 5, the silicon tetrafluoride, which is in gaseous form, passes over the impure metallurgical grade silicon 7 and forms a silicon difluoride gas which passes through valve 17 into the reaction chamber 19. The reaction chamber 19, which can be maintained at atmospheric pressure, though it need not be, is heated by an RF heater 21 which is energized by an RF power source 23 to a temperature of less than 700° C and preferably 600° C. Also, a spool 25 passes a length of fiber 27, which can be graphite or any other appropriate fiber, through the chamber 19. The fiber 27 must be electrically conductive, substantially inert with respect to the silicon, fluorine and silicon fluorides, relatively available and inexpensive and temperature stable to a temperature above the decomposition temperature of the silicon difluoride or the temperature reached in reaction chamber 19. At the temperatures within the chamber 19 the silicon difluoride which is passed thereto through the valve 17 decomposes to form pure semiconductor grade silicon and silicon tetrafluoride. A source of n-type impurity 29 sends n-type impurity through valve 31 into the chamber 19 in predetermined amounts so that the silicon along with the n-type impurity is coated onto the fiber 27 to provide a highly doped layer of n-type silicon thereon. If desired, source 29 could be added to the silicon tetrafuoride input through valve 15 rather than as shown and described. The fiber is continually wound through the chamber 19 from the spool 25 toward the spool 33, the chamber 19 being at approximately atmospheric pressure but being sufficiently closed to prevent any material leakage of any of the gases therein to the exterior of the chamber 19. The silicon tetrafluoride, which is formed in the chamber 19, is passed out of the chamber along the line 35 and recirculated through the valve 9 back to the vessel 5 for further use along with the metallurgical grade silicon to continue the continuous reaction.

It can be seen that a doped layer of silicon is formed on the fibers going directly from metallurgical grade silicon to the coated semiconductor grade silicon layer. The coated fiber is now passed through a chamber 37 wherein p-type silicon is then deposited over the n-type silicon or alternatively, p-type impurity gas is provided at a temperature of about 1200° C to form a p-type region on the upper surface of the semiconductor layer to provide a p-n junction therein. It is apparent that the material finally wound on the spool 33 is a continuous length of conductor over which is a layer of n-type material and another layer of p-type material from which solar cells can be formed. This will merely require the formation of a contact area over the p-type layer to form the cell itself.

Referring now to FIG. 2, there is shown a solar cell which is formed from plural diodes formed in accordance with the process described hereinabove. There are shown a plurality of diodes 51, each having a graphite core 53 in contact with the n-type layer 55. There are also shown contacts 57 connected to the p-type layer 59. Each of the contacts 57 are coupled together to a line 61 and each of the cores 53 are coupled together to a line 63.

As an alternative embodiment, the cores 53 or fiber 27 of FIG. 1 could be replaced by a substrate of graphite or other appropriate materials as defined above. In this case, the substrate would act as a conductor and contact to an n-type layer deposited as described with respect to the embodiment of FIG. 1 with all further steps also being identical.

The cores 53 of FIG. 2 or fiber 27 of FIG. 1 could be made by forming a thin conductive layer over a non-conducting fiber and then depositing the layers of silicon as previously described. The conductive layer in this case could even be very highly doped silicon.

Though the above invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming semiconductor grade silicon from lower grade silicon, which comprises the steps of:
   a. providing a first chamber having at least a zone thereof maintained at a temperature below about 700° C,
   b. passing a graphite fiber substrate through said zone,
   c. passing a gaseous mixture of silicon difluoride and a suitable dopant into said first chamber including said zone whereby said silicon difluoride decomposes to pure silicon which deposits on said substrate and gaseous silicon tetrafluoride,
   d. removing said silicon tetrafluoride from said first chamber,
   e. providing a second chamber containing impure silicon,
   f. heating said chamber to a temperature in the range of 750° to about 1200° C, and
   g. passing silicon tetrafluoride, including at least a portion of the silicon tetrafluoride removed from said first chamber, into said second chamber to form additional silicon difluoride which is then introduced into said first chamber.

2. A method as set forth in claim 1 further including the step of forming a region on the surface of said silicon of conductivity type opposite to said predetermined conductivity type.

3. A method as set forth in claim 2 wherein the temperature of said zone in said first chamber is about 600° C.

4. A method as set forth in claim 2 wherein the temperature in said second chamber is about 900° C.

5. A method as set forth in claim 3 wherein the temperature in said second chamber is about 900° C.

* * * * *